(12) United States Patent
Janicek et al.

(10) Patent No.: US 6,195,257 B1
(45) Date of Patent: *Feb. 27, 2001

(54) APPARATUS AND METHOD OF ADAPTING A RECTIFIER MODULE TO ENHANCE COOLING

(75) Inventors: George M. Janicek, Sunnyvale; Rui Liu, Plano; Anthony J. Scocca, Garland, all of TX (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/248,963

(22) Filed: Feb. 13, 1999

(51) Int. Cl.[7] .......................................... H05K 7/20
(52) U.S. Cl. ..................... 361/704; 361/702; 361/719; 361/724; 361/739; 361/752; 174/16.3; 174/52.1; 165/80.3; 165/185; 257/707; 257/710; 257/713
(58) Field of Search ................................. 361/704, 697, 361/709, 770, 818, 803, 710–717, 739, 741, 749, 752, 719–722; 257/707–727, 659, 772, 796; 439/78; 165/80.2, 80.3, 165, 80.4, 185; 29/827, 840, 832, 839; 174/16.3, 252, 35 GC, 52.1, 252.1

(56) References Cited

U.S. PATENT DOCUMENTS

| | | | |
|---|---|---|---|
| 2,910,628 | * 10/1959 | Keener | 317/101 |
| 3,404,362 | * 10/1968 | Amendola | 339/17 |
| 3,491,267 | * 1/1970 | Goshorn | 174/68.5 |
| 3,628,095 | * 12/1971 | Schwartz et al. | 317/101 CC |
| 3,641,474 | * 2/1972 | Owens | 339/119 R |
| 4,103,321 | * 7/1978 | Gansert et al. | 361/388 |
| 4,120,019 | * 10/1978 | Arii et al. | 361/385 |
| 4,639,834 | * 1/1987 | Mayer | 361/388 |
| 4,933,746 | * 6/1990 | King | 257/718 |
| 4,935,864 | * 6/1990 | Schmidt et al. | 363/141 |
| 5,373,418 | * 12/1994 | Hayasi | 361/707 |
| 5,436,794 | * 7/1995 | Clemente et al. | 361/704 |
| 5,554,881 | * 9/1996 | Koyasu et al. | 257/584 |
| 5,775,418 | * 7/1998 | Lonergan et al. | 165/80.2 |
| 5,784,263 | * 7/1998 | Nelson | 361/785 |
| 5,815,371 | * 9/1998 | Jeffries et al. | 361/704 |
| 5,930,112 | * 7/1999 | Babinski et al. | 361/695 |

* cited by examiner

*Primary Examiner*—Leo P. Picard
*Assistant Examiner*—Michael Datskovsky

(57) ABSTRACT

A module mount for use in electrically and mechanically mounting an encapsulated power rectifier module, having a plurality of rigid leads protruding from a major mounting surface thereof, in an orientation in which the major mounting surface is substantially normal with respect to a substantially planar circuit board. In one embodiment, the module mount includes (1) a substantially planar substrate having a plurality of apertures located to register with the plurality of rigid leads and (2) a plurality of power conductors, associated with the plurality of apertures, that electrically couple the plurality of rigid leads to an edge interface on the substrate, the edge interface adapted to be coupled to the circuit board.

12 Claims, 2 Drawing Sheets

APPARATUS AND METHOD OF ADAPTING A RECTIFIER MODULE TO ENHANCE COOLING

TECHNICAL FIELD OF THE INVENTION

The present invention is directed, in general, to mounting techniques for electronic components and, more specifically, to an apparatus and method of adapting a rectifier module to enhance cooling of the same.

BACKGROUND OF THE INVENTION

Rectifier modules are commonly available in a number of package styles, each suitable for a particular range of voltage and current. A rectifier module generally includes a rectifier bridge (in die form) encapsulated in a substantially flat, rectangular package having two parallel major surfaces and a number of minor surfaces normal to the major surfaces. The major and minor surfaces are designated as such to indicate that a surface area of the major surface is greater than a surface area of the minor surface. Bond wires couple the rectifier bridge die to rigid leads that protrude from the package.

Rectifier modules employable in low to medium power applications (e.g., up to 800 W) are typically embodied in a so-called "vertical" package wherein the leads protrude from a minor surface of the package and are arranged in a single row. The "vertical" package is designed to be mounted "vertically," with its major surfaces substantially normal to a circuit board. While the "vertical" package occupies minimal board real-estate, some of the bond wires coupling bond pads on the rectifier bridge die to bond pads on the package (at the leads) may be relatively long. Long bond wires are subject to many disadvantages, such as, limited current carrying capacity or fatigue fractures. Further, the leads of the "vertical" package are usually spaced 0.1' apart in accordance with conventional through-hole component mounting specifications. The 0.1' spacing limits a maximum voltage difference that may exist across the leads before arcing occurs. The thickness of the leads is also constrained by the through-hole component mounting specifications, thereby limiting an amount of current that each lead may carry. The fixed lead spacing and lead thickness thus restrict both the voltage and current rating of the rectifier module.

Rectifier modules employable in high power applications (e.g., 800 to 3000 W) are typically embodied in a so-called "horizontal" package wherein the leads protrude from a major mounting surface of the package. The "horizontal" package is designed to be mounted "horizontally," with its major surfaces substantially parallel to the circuit board. The "horizontal" package has the leads arranged in a grid pattern on the major surface, thereby allowing the leads to be spaced further apart. Further, lead spacing and lead thickness are not constrained to the through-hole component mounting specifications. The increased spacing between the leads thus allows the rectifier module to be operated at higher voltages (e.g., 800 V and above) without causing arcing between the leads. Additionally, the pin thickness may be increased to enable the rectifier module to operate at higher current levels.

While the "horizontal" package is capable of operating at higher power levels, significantly more board real-estate is required. Additionally, since a height of the "horizontal" package is less than a height of many components (e.g., capacitors, power switches), a large heat sink cannot be mounted directly onto the major cooling surface of the rectifier module when the "horizontal" package is mounted in its intended manner. Therefore, a spacer must be employed to extend the heat sink above the other components. Since the spacer should be thermally conductive to transfer heat from the rectifier module to the heat sink, the cost of the spacer can be prohibitive.

Accordingly, what is needed in the art is a module mount for mounting a rectifier module operable at high power levels that avoids the deficiencies of the prior art.

SUMMARY OF THE INVENTION

To address the above-discussed deficiencies of the prior art, the present invention provides a module mount for use in electrically and mechanically mounting an encapsulated power rectifier module, having a plurality of rigid leads protruding from a major mounting surface thereof, in an orientation in which the major mounting surface is substantially normal with respect to a substantially planar circuit board. In one embodiment, the module mount includes (1) a substantially planar substrate having a plurality of apertures located to register with the plurality of rigid leads and (2) a plurality of power conductors, associated with the plurality of apertures, that electrically couple the plurality of rigid leads to an edge interface on the substrate, the edge interface adapted to be coupled to the circuit board.

The present invention therefore introduces a module mount that, in one embodiment, allows the encapsulated power rectifier module to be mounted with its major mounting surface substantially normal to the circuit board. The encapsulated power rectifier module thus occupies less board real-estate than if it were mounted with its major mounting surface substantially parallel to the circuit board.

In one embodiment of the present invention, the encapsulated power rectifier module further has a major cooling surface opposite the major mounting surface. In another embodiment, the module mount further includes a heat sink, mechanically and thermally coupled to the encapsulated power rectifier module to enhance cooling thereof. In an embodiment to be illustrated and described, the heat sink is mechanically and thermally coupled to the major cooling surface of the encapsulated power rectifier module while the module mount is mechanically and electrically coupled to the major mounting surface.

In a related embodiment, the heat sink is further mechanically coupled to the circuit board. The heat sink may thus provide mechanical support to the encapsulated power rectifier module and module mount.

In another embodiment of the present invention, the heat sink is couplable to a second encapsulated power rectifier module. The two encapsulated power rectifier modules may thus cooperate to reduce power dissipation therein.

In yet another embodiment of the present invention, the module mount further includes a connector, coupled to the edge interface, that connects the substrate to a mating connector on the circuit board. In another embodiment, the edge interface has projecting members adapted to mate directly to corresponding apertures on the circuit board. Costs associated with the connector and mating connector may thus be avoided.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
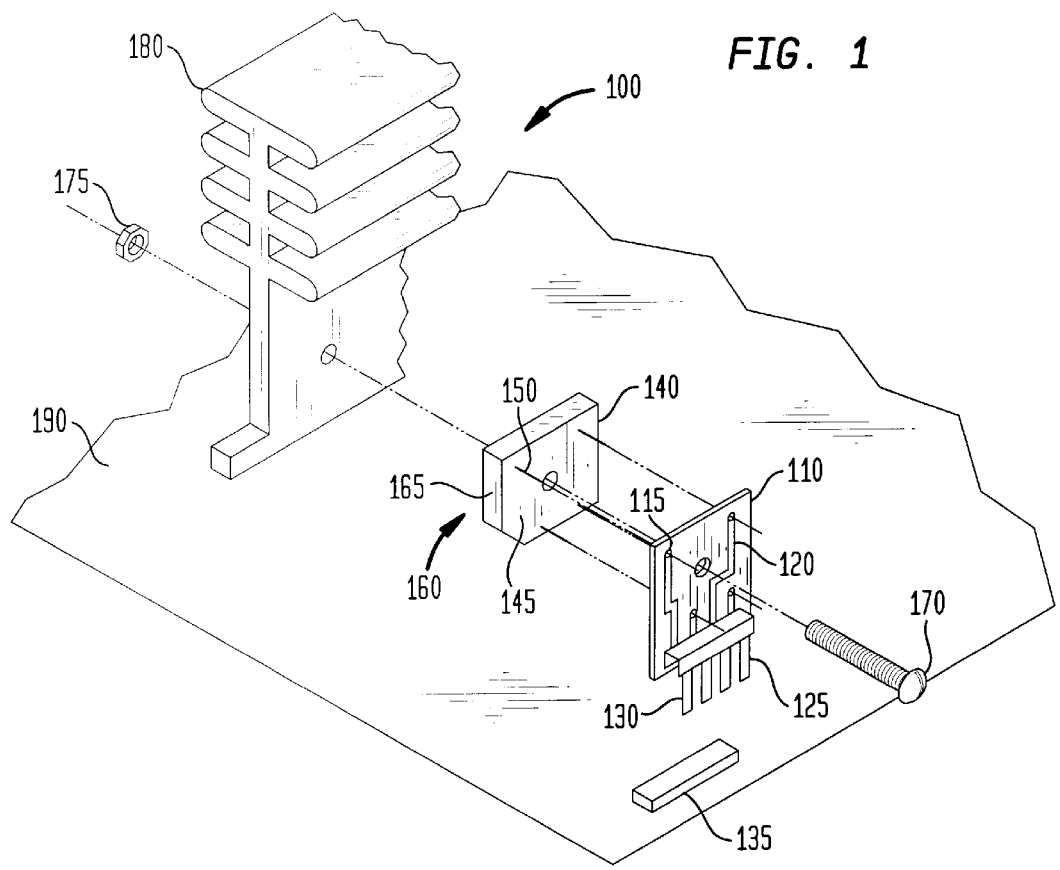
FIG. 1 illustrates an embodiment of a module mount constructed in accordance with the principles of the present invention.

Referring initially to FIG. 1, illustrated is an embodiment of a module mount 100 constructed in accordance with the principles of the present invention. The module mount 100 is employed to mechanically and electrically mount an encapsulated power rectifier module (rectifier module) 140 to a circuit board 190.

The rectifier module 140 is designed for high power applications and is, therefore, embodied in a "horizontal" package.

The rectifier module 140 has a major mounting surface 145 and a major cooling surface 160 opposite the major mounting surface 145. The rectifier module 140 further has a number of rigid leads (one of which is labeled 150) protruding from the major mounting surface 145. In the illustrated embodiment wherein the rectifier module 140 is a diode bridge, the rectifier module 140 has four rigid leads 150. The leads 150 are spaced sufficiently far apart to enable the rectifier module 140 to accommodate high voltages (e.g., 800 V and above) and are of sufficient thickness to allow the rectifier module 140 to carry high currents (e.g., up to 15 A, with higher transient current capability). The rectifier module 140 further has a number of minor surfaces (one of which is labeled 165) substantially normal to the major mounting surface 145 and the major cooling surface 160.

In the illustrated embodiment, the module mount 100 includes a substantially planar substrate 110 having a plurality of apertures 115 located to register with the leads 150 protruding from the rectifier module 140. The module mount 100 further includes a number of power conductors 120, associated with the apertures 115, that electrically couple the rigid leads 150 to an edge interface 125 on the substrate 110. Power conductors as used herein refer to traces embedded in the substrate 110 that are capable of carry more than 15 A.

In the illustrated embodiment, the edge interface 125 has a connector 130 mounted thereon that allows the substrate 110 to be coupled to a mating connector 135 on the circuit board 190 in an orientation wherein the substrate 110 is substantially normal to the circuit board 190. The rectifier module 140 is then mounted to the substrate 110 with the major mounting and cooling surfaces 145, 160 substantially normal to the circuit board 190. The module mount 110 thus allows the rectifier module 140 to be mounted in such a way as to occupy less board real-estate than if the rectifier module 140 were to be conventionally mounted (e.g., with the major mounting and cooling surfaces 145, 160 substantially parallel to the circuit board 190). While the illustrated embodiment employs the connector 130 and mating connector 135, those skilled in the art will realize that the connector 130 and mating connector 135 are not required by the principles of the present invention. In an alternative embodiment, the edge interface 125 may be designed to couple directly to the circuit board 190 without requiring the connector 130 or the mating connector 135, thereby avoiding costs associated therewith.

The module mount 100 still further includes a heat sink 180, mechanically and thermally coupled to the rectifier module 140. While only one embodiment of the heat sink 180 is illustrated, those skilled in the art are familiar with a variety of heat sink configurations that may be employed to advantage with the principles of the present invention. In the illustrated embodiment, the rectifier module 140 is soldered to the substrate 110 and the combination thereof is then mechanically coupled to the heat sink 180 via a machine screw 170 and a mating nut 175. Of course, other methods of mechanically and thermally coupling the heat sink 180 to the rectifier module 140 are well within the scope of the present invention. The major cooling surface 160 of the rectifier module 140 is thus thermally coupled to the heat sink 180. Directly coupling the rectifier module 140 to the heat sink 180 precludes the necessity of employing the thermally conductive spacer of the prior art. The heat sink 180 may, therefore, enhance the cooling of the rectifier module 140 by removing a portion of the heat generated.

In one embodiment of the present invention, the heat sink 180 may be mechanically coupled directly to the circuit board 190, thus mechanically supporting the rectifier module 140 and the substrate 110. Those skilled in the art will realize, of course, that the heat sink 180 need not be mechanically coupled directly to the circuit board 190 but may, for example, be mechanically supported by the substrate 110.

Figure 2:
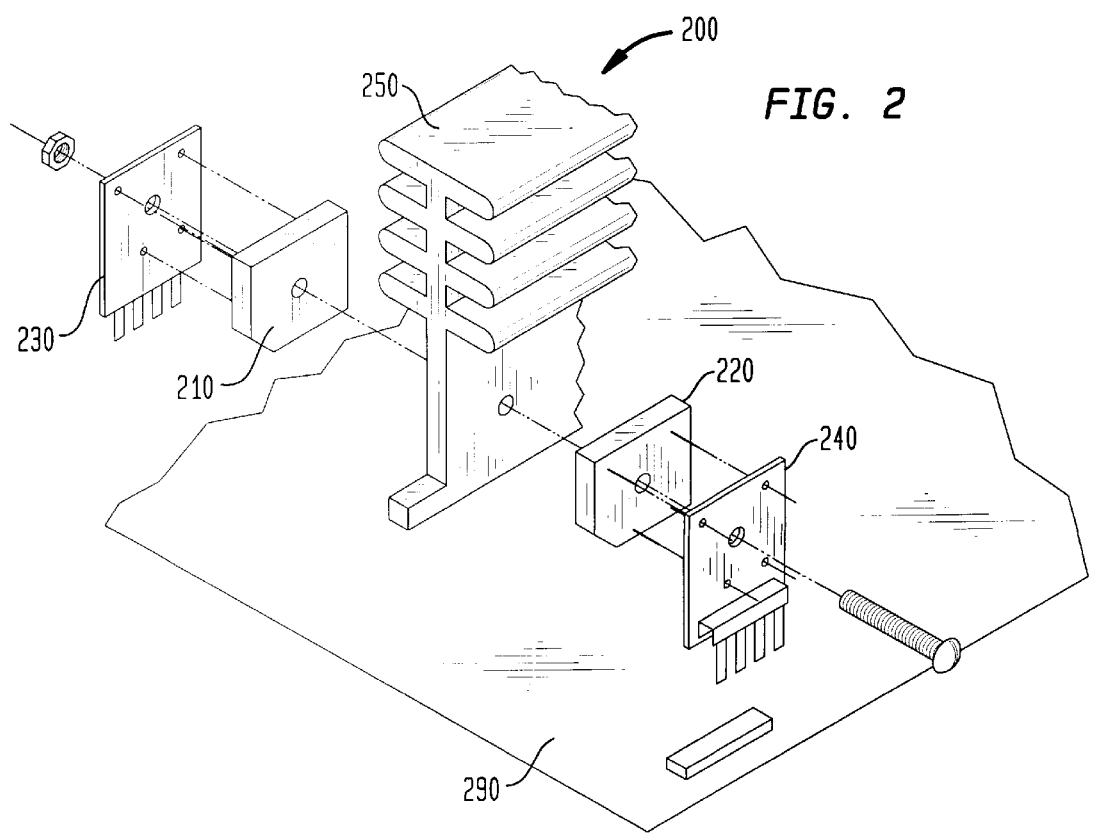
FIG. 2 illustrates an embodiment of a power converter constructed in accordance with the principles of the present invention.

Turning now to FIG. 2, illustrated is an embodiment of a power converter 200 constructed in accordance with the principles of the present invention. The power converter 200 includes a circuit board 290 having power stage components mounted thereupon. The power converter 200 further includes a heat sink 250 having opposite first and second heat-receiving surfaces oriented substantially normal to a plane of the circuit board 290. The power converter 200 further includes first and second encapsulated power rectifier modules 210, 220. In the illustrated embodiment, each module is embodied in "horizontal" package wherein a plurality of rigid leads protrude from a major mounting surface thereof. The power converter 200 still further includes first and second module mounts 230, 240 employable to couple the first and second rectifier modules 210, 220 to the circuit board 290.

In the illustrated embodiment, the first and second rectifier modules 210, 220 are soldered to the first and second module mounts 230, 240, respectively. The first and second module mounts 230, 240 thus mechanically and electrically couple both the first and second rectifier modules 210, 220 to the circuit board 290. The first and second module mounts 230, 240 are designed to position the first and second rectifier modules 210, 220 in an orientation wherein the major cooling surfaces are substantially parallel to and in thermal communication with the first and second heat-receiving surfaces of the heat sink 250. The first and second module mounts 230, 240 thus allow the first and second rectifier modules 210, 220 to occupy an amount of board real-estate typically required by a single rectifier module. Employing two rectifier modules 210, 220, however, allows the power loss in each rectifier module 210, 220 to be reduced, thereby substantially reducing the operating temperature of each rectifier module 210, 220.

Figure 3:
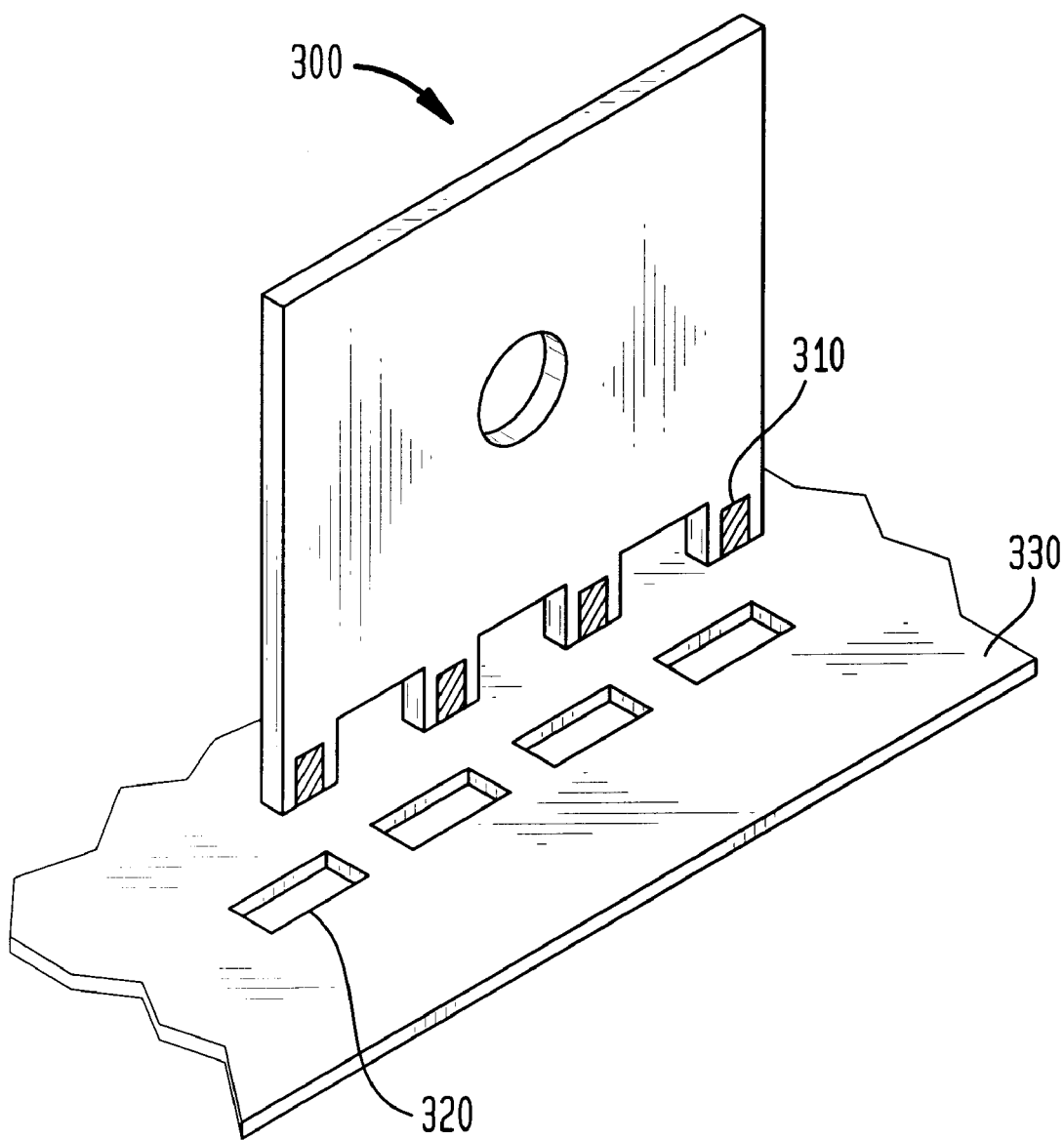
FIG. 3 illustrates an exemplary edge connection of the module mount of FIG. 1.

Turning now to FIG. 3, illustrated is an exemplary edge connection of a module mount 300 constructed in accordance with the principles of the present invention. FIGS. 1 and 2 illustrate module mounts having a connector mounted on the edge interface. While the connector allows the module mount to be easily coupled to and de-coupled from the mating connector on the circuit board, the cost of the connector and mating connector may be prohibitive in some applications.

The module mount 300, therefore, employs an edge interface having projecting members (one of which is designated 310) adapted to mate directly to corresponding apertures (one of which is designated 32) on a circuit board 330. The projecting members 310 may be plated with a conductive material to allow the module mount 300 to be soldered to the circuit board 330. The module mount 300 may thus be both electrically and mechanically coupled to the circuit board 330.

From the above, it is apparent that the present invention provides, a module mount for use in electrically and mechanically mounting an encapsulated power rectifier module, having a plurality of rigid leads protruding from a major mounting surface thereof, in an orientation in which the major mounting surface is substantially normal with respect to a substantially planar circuit board. In one embodiment, the module mount includes (1) a substantially planar substrate having a plurality of apertures located to register with the plurality of rigid leads and (2) a plurality of power conductors, associated with the plurality of apertures, that electrically couple the plurality of rigid leads to an edge interface on the substrate, the edge interface adapted to be coupled to the circuit board.

For a better understanding of power electronics, including power supplies and rectifiers, see *Power Electronics: Converters, Applications and Design*, by N. Mohan, T. M. Undeland and W. P. Robbins, John Wiley & Sons Publishing Company (1989), incorporated herein by reference.

Although the present invention has been described in detail, those skilled in the art should understand that they can make various changes, substitutions and alterations herein without departing from the spirit and scope of the invention in its broadest form.

What is claimed is:

1. A module mount for use in mounting a high power rectifier on a substantially planar circuit board, comprising:

a module encapsulating said high power rectifier, said module having a major mounting surface and an opposing major cooling surface, said major mounting surface having a plurality of rigid leads protruding therefrom spaced to accommodate high voltages and having sufficient thickness to carry high currents;

a substantially planar substrate coupled to said major mounting surface, said planar substrate configured to be coupled to said planar circuit board in a substantially normal position and having a plurality of apertures located to contact and register with said plurality of rigid leads;

a plurality of power conductors, integrally formed with said substrate and proximate said plurality of apertures, that electrically couple said plurality of rigid leads to an edge interface on said substrate; and a heat sink mechanically and thermally coupled to said major cooling surface, said heat sink couplable to at least one additional module encapsulating a high power rectifier having a plurality of rigid leads protruding from a major mounting surface thereof.

2. The module mount as recited in claim 1 wherein said heat sink is further mechanically coupled to said circuit board.

3. The module mount as recited in claim 1 further comprising a connector, coupled to said edge interface, that connects said substrate to a mating connector on said circuit board.

4. The module mount as recited in claim 1 wherein said edge interface has projecting members that mate directly to corresponding apertures on said circuit board.

5. A method of manufacturing a module mount for use in mounting a high power rectifier on a substantially planar circuit board, comprising:

forming a module encapsulating said high power rectifier, said module having a major mounting surface and an opposing major cooling surface, said major mounting surface having a plurality of rigid leads protruding therefrom spaced to accommodate high voltages and having sufficient thickness to carry high currents;

forming a substantially planar substrate configured to be coupled to said planar circuit board in a substantially normal position and coupling said substrate to said major mounting surface, said substrate having a plurality of apertures located to contact and register with said plurality of rigid leads;

forming a plurality of power conductors, integrally with said substrate and proximate said plurality of apertures, that electrically couple said plurality of rigid leads to an edge interface on said substrate; and coupling to said major cooling surface a heat sink, said heat sink couplable to at least one additional module encapsulating a high power rectifier having a plurality of rigid leads protruding from a major mounting surface thereof.

6. The method as recited in claim 5 further comprising mechanically coupling said heat sink to said circuit board.

7. The method as recited in claim 5 further comprising connecting said substrate to a mating connector on said circuit board with a connector, coupled to said edge interface.

8. The method as recited in claim 5 wherein said edge interface has projecting members, said method further comprising directly mating said projecting members to corresponding apertures on said circuit board.

9. A power supply, comprising:

a substantially planar circuit board;

a heat sink having a heat-receiving surface oriented substantially normal to said planar circuit board; and a module mount, including:

a module encapsulating a high power rectifier, said module having a major mounting surface and an opposing major cooling surface, said major mounting surface having a plurality of rigid leads protruding therefrom spaced to accommodate high voltages and having a sufficient thickness to carry high currents, a substantially planar substrate coupled to said major mounting surface, said planar substrate configured to be coupled to said planar circuit board in a substantially normal position and having a plurality of apertures located to contact and register with said plurality of rigid leads, and a plurality of power conductors, integrally formed with said substrate and proximate said plurality of apertures, that electrically couple said plurality of rigid leads to an edge interface on said substrate, and a heat sink mechanically and thermally coupled to said major cooling surface, said heat sink couplable to at least one additional module encapsulating a high power rectifier having a plurality of rigid leads protruding from a major mounting surface thereof.

10. The power supply as recited in claim 9 wherein said heat sink is further mechanically coupled to said circuit board.

11. The power supply as recited in claim 9 further comprising a connector, coupled to said edge interface, that connects said substrate to a mating connector on said circuit board.

12. The power supply as recited in claim 9 wherein said edge interface has projecting members that mate directly to corresponding apertures on said circuit board.

* * * * *